United States Patent
Leung et al.

(10) Patent No.: US 6,436,770 B1
(45) Date of Patent: Aug. 20, 2002

(54) METHOD TO CONTROL THE CHANNEL LENGTH OF A VERTICAL TRANSISTOR BY FIRST FORMING CHANNEL USING SELECTIVE EPI AND SOURCE/DRAIN USING IMPLANTATION

(75) Inventors: Ying Keung Leung, Aberdeen (HK); Yelehanka Ramachandramurthy Pradeep; Jia Zhen Zheng, both of Singapore (SG); Lap Chan, San Francisco, CA (US); Elgin Quek, Singapore (SG); Ravi Sundaresan, San Jose, CA (US); Yang Pan; James Yong Meng Lee, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 130 days.

(21) Appl. No.: 09/721,720

(22) Filed: Nov. 27, 2000

(51) Int. Cl.[7] .................. H01L 21/332; H01L 21/00; H01L 21/336; H01L 21/8238
(52) U.S. Cl. .................. 438/268; 438/137; 438/138; 438/156; 438/192; 438/212
(58) Field of Search ............... 438/192, 137, 438/138, 156, 206, 212, 268

(56) References Cited

U.S. PATENT DOCUMENTS

| | | | |
|---|---|---|---|
| 4,835,586 A | 5/1989 | Cogan et al. ............ 357/23.14 |
| 4,967,245 A | 10/1990 | Cogan et al. ............ 357/23.4 |
| 5,061,645 A * | 10/1991 | Nakazato et al. ............ 438/337 |
| 5,144,403 A * | 9/1992 | Chiang et al. ............ 257/514 |
| 5,293,053 A * | 3/1994 | Malhi et al. ............ 257/330 |
| 5,416,350 A | 5/1995 | Watanabe ............ 257/330 |
| 5,753,947 A * | 5/1998 | Gonzalez ............ 257/276 |
| 5,899,710 A | 5/1999 | Mukai ............ 438/156 |
| 6,013,548 A * | 1/2000 | Burns, Jr. et al. ............ 438/242 |
| 6,015,725 A * | 1/2000 | Hirayama ............ 438/156 |
| 6,300,198 B1 * | 10/2001 | Aeugle et al. ............ 438/268 |
| 6,333,533 B1 * | 12/2001 | Furukawa et al. ............ 257/301 |
| 6,337,247 B1 * | 1/2002 | Schulz et al. ............ 438/268 |
| 6,348,374 B1 * | 2/2002 | Athavale et al. ............ 438/243 |
| 6,352,882 B1 * | 3/2002 | Assaderaghi et al. ....... 438/155 |
| 6,362,025 B1 * | 3/2002 | Patti et al. ............ 438/138 |
| 6,391,699 B1 * | 5/2002 | Madson et al. ............ 438/212 |

FOREIGN PATENT DOCUMENTS

| | | | |
|---|---|---|---|
| JP | 404267371 A | * | 9/1992 |
| JP | 406045539 A | * | 2/1994 |
| JP | 406350102 A | * | 12/1994 |
| JP | 408051203 A | * | 2/1996 |
| JP | 409129874 A | * | 5/1997 |
| JP | 410214846 A | * | 8/1998 |
| JP | 410256510 A | * | 9/1998 |

* cited by examiner

Primary Examiner—Caridad Everhart
Assistant Examiner—Chuong Luu
(74) Attorney, Agent, or Firm—George O. Saile; Rosemary L. S. Pike; William J. Stoffel

(57) ABSTRACT

A method for a vertical MOS transistor whose vertical channel width can be accurately defined and controlled. Isolation regions are formed in a substrate. The isolation regions defining an active area. Then, we form a source region in the active area. A dielectric layer is formed over the active area and the isolation regions. We form a barrier layer over the dielectric layer. We form an opening in the barrier layer. A gate layer is formed in the opening. We form an insulating layer over the conductive layer and the barrier layer. We form a gate opening through the insulating layer, the gate layer and the dielectric layer to expose the source region. Gate dielectric spacers are formed over the sidewalls of the gate layer. Then, we form a conductive plug filling the gate opening. The insulating layer is removed. We form a drain region in top and side portions of the conductive plug and form doped gate regions in the gate layer. The remaining portions of the conductive plug comprise a channel region. A channel length is between the top of the source region and the drain region. We form an interlevel dielectric layer over the barrier layer, the gate layer, and the conductive plug. Contacts are formed through the interlevel dielectric layer to the doped gate regions, the drain region and the source region.

19 Claims, 3 Drawing Sheets

METHOD TO CONTROL THE CHANNEL LENGTH OF A VERTICAL TRANSISTOR BY FIRST FORMING CHANNEL USING SELECTIVE EPI AND SOURCE/DRAIN USING IMPLANTATION

BACKGROUND OF INVENTION

1) Field of the Invention

This invention relates generally to fabrication of semiconductor devices and more particularly to the fabrication of a vertical MOS transistors.

2) Description of the Prior Art

Current lateral MOS transistor technology uses lithography to define channel length. This limits the channel length control to that of the lithography process. This lithography process control is not as good as deposition techniques.

Vertical junction MOS transistors have a vertical channel region. However, current methods for fabricating vertical transistor do not have acceptable methods to control the channel length. This is even more important as transistors are further scaled down.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,416,3509 (Watanabe) shows a vertical Tx process.

U.S. Pat. No. 5,899,710 (Mukai) shows a TX with gates surrounding the channel region.

U.S. Pat. No. 4,835,586 (Cogan et al.) shows a vertical dual gate process.

U.S. Pat. No. 4,967,245 (Cogan et al.) shows a vertical Tx in a trench.

However, these patents can be further improved upon.

SUMMARY OF THE INVENTION

It is an object of the present invention to provide a method for fabricating a vertical MOS transistor.

It is an object of the present invention to provide a method for fabricating a method for fabricating a vertical MOS transistor that has a controllable channel length.

It is an object of the present invention to provide a method for fabricating a method for fabricating a vertical MOS transistor that the channel length is controlled by the channel deposition process.

To accomplish the above objectives, the present invention provides a method of manufacturing a vertical MOS transistor.

The method begins by forming isolation regions in a substrate. The isolation regions defining an active area. Then, we form a source region in the active area. We form a dielectric layer over the active area and the isolation regions. We form a barrier layer over the dielectric layer. We form an opening in the barrier layer. The opening at least partially over the active area. We form a gate layer (e.g. conductive layer) in the opening. We form an insulating layer over the conductive layer and the barrier layer. We form a gate opening through the insulating layer, the gate layer and the dielectric layer to expose the source region. The gate opening is defined at least by sidewalls of the conductive layer. Gate dielectric spacers are formed over the sidewalls of the gate layer. Then, we form a conductive plug filling the gate opening. The insulating layer is removed. The insulating layer is removed by an etch selective to the barrier layer and the gate layer. We form a drain region in top and side portions of the conductive plug and form doped gate regions in the gate layer. The remaining portions of the conductive plug comprise a channel region. A channel length is between the top of the source region and the drain region. We form an interlevel dielectric layer over the barrier layer, the gate layer, and the conductive plug. We form contacts through the interlevel dielectric layer to the doped gate regions, the drain region and the source region.

The present invention has the benefit of providing a method for fabricating a vertical MOS transistor that has a controllable channel length. The method controls the channel length by the channel deposition process. This is more accurate than conventional lithographical techniques.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. A preferred embodiment of the invention's method of fabrication of a vertical transistor is described below and shown in FIGS. 1 to 8. Below a NMOS transistor is described, but PMOS devices can be formed as well known by those skilled in the art.

Figure 1:
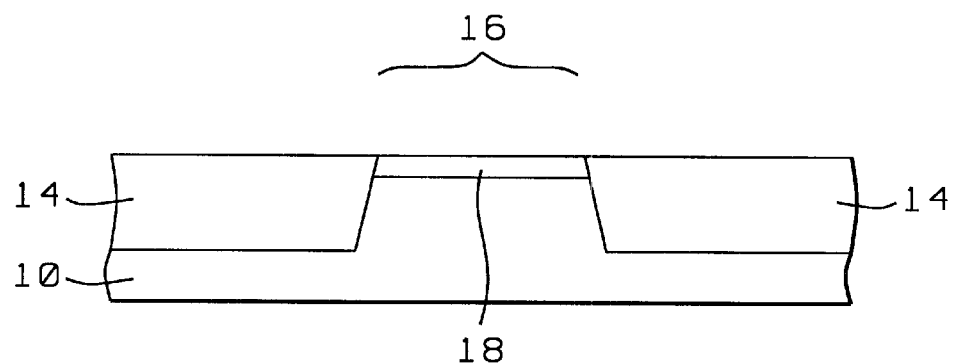
FIGS. 1 through 8 are cross sectional views for illustrating a preferred embodiment of a method for manufacturing a vertical transistor according to the present invention.

Referring to FIG. 1, isolation regions 14 are formed in a substrate 10. The isolation regions 14 define at least one active area 16. The isolation regions are preferably shallow trench isolation (STI) regions.

Still referring to FIG. 1, we form a source region 18 in the active area 16.

The source region 18 is preferably formed by an ion implantation process. To form a NMOS device, the Source and drain regions are N-type.

Next, we form a dielectric layer 20 over the active area 16 and the isolation regions 14. The dielectric layer 20 is preferably comprised of silicon oxide preferably having a thickness of between about 20 and 100 Å.

Figure 2:
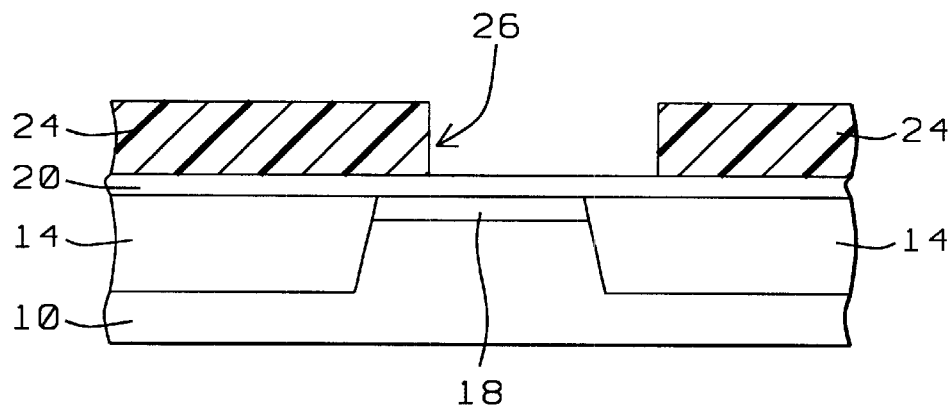

As shown in FIG. 2, a barrier layer 24 having an opening 26 is formed over the dielectric layer 20. The barrier 24 layer is comprised of silicon nitride having a thickness of between about 50 and 1000 Å.

Still referring to FIG. 2, after a blanket barrier layer is formed, the opening 26 is formed in the barrier layer. The opening 16 extends at least partially over the active area 16.

Figure 3:
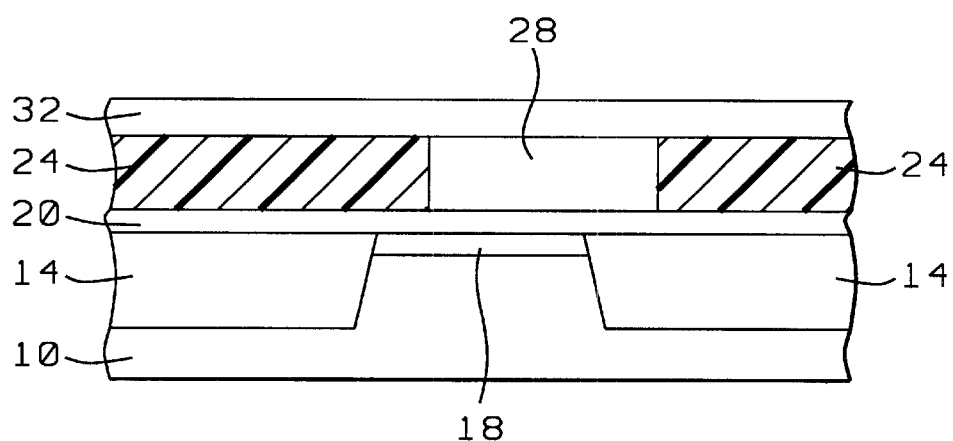

As shown in FIG. 3, we form a gate layer 28 (e.g. conductive layer 28) in the opening 26. The gate layer is preferably comprised of polysilicon and is preferably n-doped for a NMOS Tx. The gate layer can be formed of a metal such as Ti. The extra gate material can be removed by a chemical-mechanical polish (CMP) step.

Still referring to FIG. 3, we form an insulating layer 32 over the conductive layer 28 and the barrier layer 24. The insulating layer 32 is preferably comprised of silicon oxide and preferably has a thickness of between about 50 and 2000 Å. The barrier layer 24 and insulating layer 32 preferably have an etch rate ratio between 1:2 and 1:100 so that the barrier layer can be etch selectively to the insulating layer 32.

Figure 4:
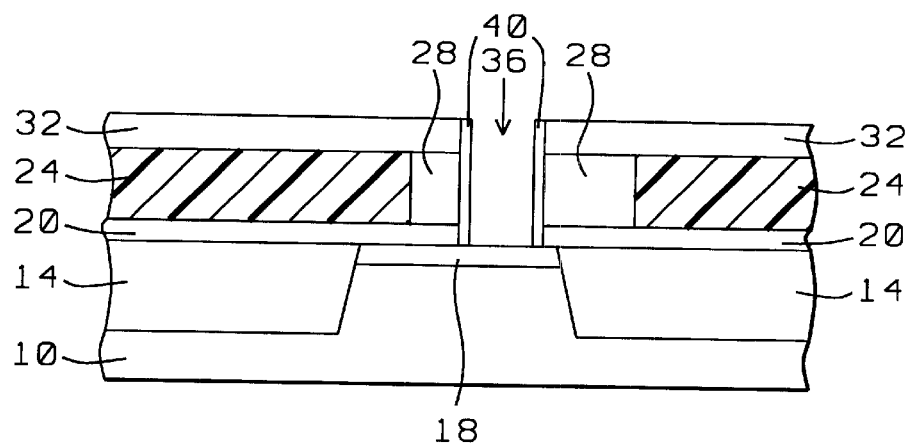

As shown in FIG. 4, we form a gate opening 36 through the insulating layer 32, the gate layer 28 and the dielectric layer 20 to expose at least a portion of the source region 18. The gate opening 36 defines at least by sidewalls of the conductive layer 28. The gate opening 36 preferably has width of between about 0.01 and 0.1 $\mu$m.

Still referring to FIG. 4, gate dielectric spacers 40 are formed over the sidewalls of the gate layer 28. The gate dielectric spacers 40 are preferably comprised of silicon oxide or high K materials (i.e., K>3.0) and has a thickness of between about 10 and 100 Å.

The gate dielectric spacers 40 preferably formed by depositing a gate dielectric layer (not shown) and anisotropically etching back the gate dielectric layer.

Figure 5:
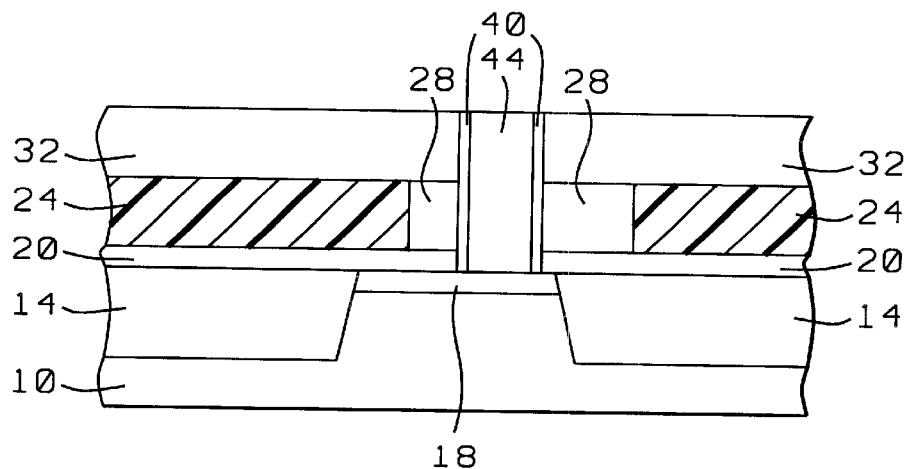

Referring to FIG. 5, we form a conductive plug 44 filling the gate opening 36. The conductive plug is preferably formed by a selective epitaxy process and the conductive plug is comprised of silicon.

Figure 6:
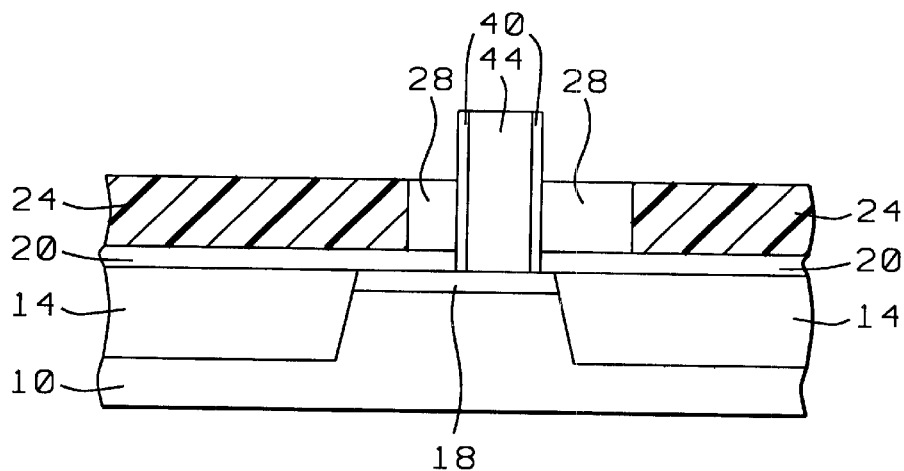

FIG. 6 shows the step of removing the insulating layer 32. The insulating layer 32 can be removed by a selective wet or dry etch. The insulating layer 32 is preferably removed by an etch selective to the barrier layer 24 and the gate layer 28 (e.g., conductive layer).

Figure 7:
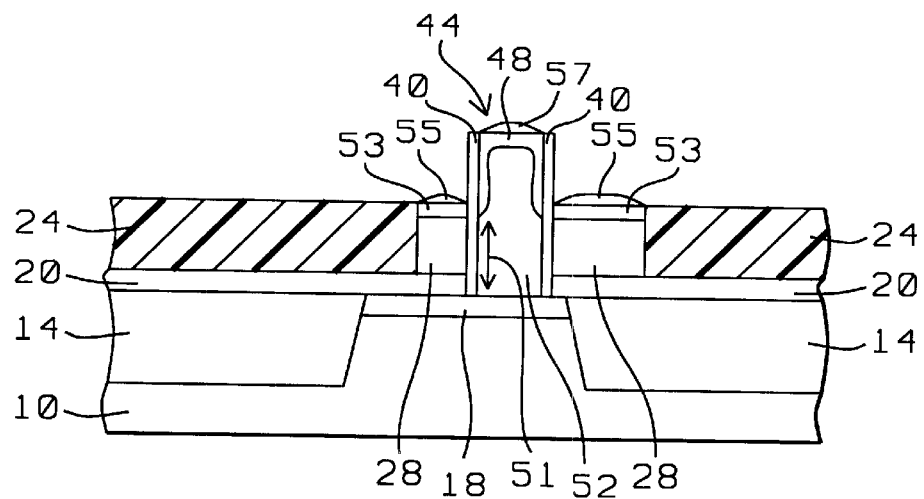

As shown in FIG. 7, we form a drain region 48 in top and side portions of the conductive plug 44 and forming doped gate regions 53 in the gate layer 28. The remaining (undoped) portions of the conductive plug 44 comprise a channel region 52.

The drain regions 48 preferably formed by an angled ion implant. The angled implant preferably comprises: N-type dopant of P or AS or Sb or a P-type dopant of B and a dose between 1E15 and 1E16 atom/cc, and energy between 200 ev and 100 Kev.

A channel length 51 is between the top of the source region 18 and the drain region 18. The channel length 51 is preferably between about 50 and 1000 Å.

Still referring to FIG. 7, in an optional, but preferred step, silicide regions 55 are formed on the gate layer 28 and on the top of the conductive plug 44 (over the drain 48). The silicide regions are very important because they reduce resistance and are not shown in the prior art.

Figure 8:
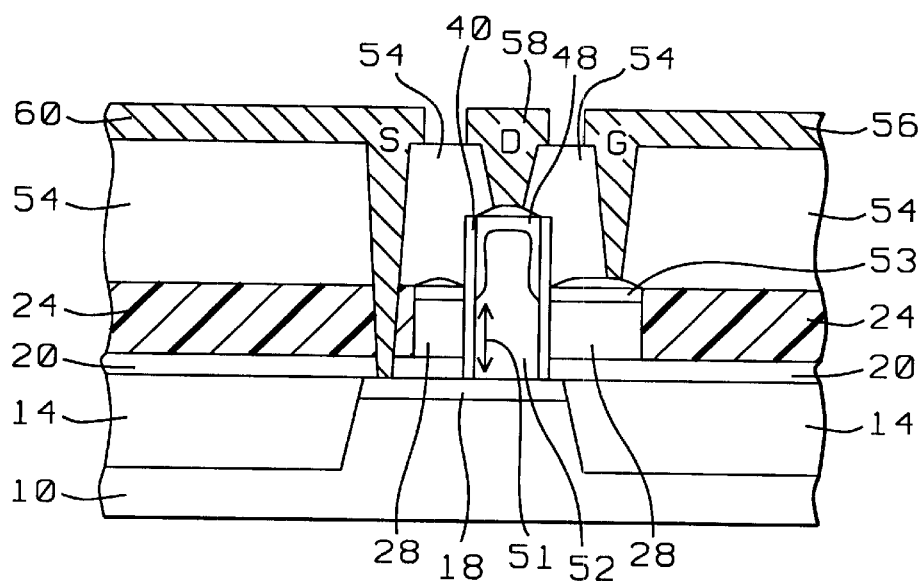

As shown in FIG. 8, we form an interlevel dielectric layer 54 over the barrier 24 layer, the gate layer 28, and the conductive plug 44. The interlevel dielectric layer is preferably comprised of a doped or undoped oxide such as Fluorine silicate glass (FSG) or phosphosilicate glass (PSG).

Still referring to FIG. 8, we form contacts 56 58 60 through the interlevel dielectric layer 54 to electrically connect to the doped gate regions 53, the drain region 48 and the source region 18. Contact holes are formed in the interlevel dielectric layer 54. The contact holes are filled with conductive contacts material.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

As a postscript to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

As used in the subject invention, etching refers to chemically eating away a material to form a desired pattern. Selectively etching refers to the use of etching to remove selected portions of one material from another in a semiconductor structure. Silicon, as used in this application, includes polysilicon (polycrystalline silicon), amorphous silicon (non-crystalline silicon), monocrystalline silicon and silicon/germanium materials. Such silicon may be n- or p-doped, or undoped.

CVD refers to chemical vapor deposition. LPCVD refers to low pressure chemical vapor deposition. Ion implantation refers to the implantation of ions, for example, for doping a semiconductor substrate.

Electronic element refers to active electronic devices and passive component parts. Electrical conductor refers to a material which readily conducts electricity and includes metals, p-type material (semiconductor material that has been doped with an acceptor-type impurity and conducts current via hole migration), and n-type material (semiconductor material that has been doped with a donor-type impurity and conducts a current via electrons).

Oxide as used in the subject invention refers to silicon oxides and nitride as used herein refers to silicon nitride. The oxide may be doped or undoped, such as FSG, PSG (phospho-silicate glass) or BPSG (Boron doped PSG). An insulation layer or insulator layer refers to a layer having a high resistivity, which does not conduct electricity. It may act as a sodium barrier. For the purposes of the present invention, the insulation layer should be capable of being selectively etched to nitride.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a vertical transistor; comprising the steps of:
   a) forming isolation regions in a substrate; said isolation regions defining an active area;
   b) forming a source region in said active area;
   c) forming a dielectric layer over said active area and said isolation regions;
   d) forming a barrier layer over said dielectric layer;
   e) forming an opening in said barrier layer; said opening at least partially over said active area;
   f) forming a gate layer in said opening;
   g) forming an insulating layer over said conductive layer and said barrier layer;
   h) forming a gate opening through said insulating layer, said gate layer and said dielectric layer to expose said source region; said gate opening defines at least by sidewalls of said conductive layer;
   i) forming a gate dielectric spacers over said sidewalls of said gate layer;
   j) forming a conductive plug filling said gate opening;
   k) removing said insulating layer;
   l) forming a drain region in top and side portions of said conductive plug and forming doped gate regions in said gate layer; the remaining portions of said conductive plug comprise a channel region;
   m) forming an interlevel dielectric layer over said barrier layer, said gate layer, and said conductive plug; and
   n) forming contacts through said interlevel dielectric layer to said doped gate regions, said drain region and said source region.

2. The method of claim 1 wherein said dielectric layer comprised of silicon oxide has a thickness of between about 20 and 100 Å.

3. The method of claim 1 wherein said barrier layer is comprised of silicon nitride having a thickness of between about 50 and 1000 Å.

4. The method of claim 1 wherein said barrier layer and said insulating layer have an etch rate ratio between 1:2 and 1:100 so that said insulating layer can be etched selectively to said barrier layer.

5. The method of claim 1 wherein said gate dielectric spacers is comprised of silicon oxide and has a thickness of between about 10 and 100 Å.

6. The method of claim 1 wherein said gate dielectric spacers formed by depositing a gate dielectric layer and anisotropically etching back said gate dielectric layer.

7. The method of claim 1 wherein said conductive plug is formed by a selective epitaxy process and said conductive plug is comprised of silicon.

8. The method of claim 1 wherein said insulating layer is removed by an etch selective to said barrier layer and said gate layer.

9. The method of claim 1 wherein said drain regions formed by an angled ion implant using P ions at a dose between 1E15 and 1E16 ions/cm$^2$ and an energy between 200 ev and 100 Kev.

10. The method of claim 1 wherein said channel length is between the top of said source region and said drain region; said channel length is preferably between about 50 and 100 Å.

11. The method of claim 1 which further includes after step (1) forming silicide regions on the top of said conductive plug and on said gate layer.

12. A method of fabrication of a vertical transistor; comprising the steps of
   a) forming isolation regions in a substrate; said isolation regions defining an active area;
   b) forming a source region in said active area;
   c) forming a dielectric layer over said active area and said isolation regions;
   d) forming a barrier layer over said dielectric layer;
   e) forming an opening in said barrier layer; said opening at least partially over said active area;
   f) forming a gate layer in said opening;
   g) forming an insulating layer over said conductive layer and said barrier layer;
   h) forming a gate opening through said insulating layer, said gate layer and said dielectric layer to expose said source region; said gate opening defines at least by sidewalls of said conductive layer;
   i) forming a gate dielectric spacers over said sidewalls of said gate layer;
   j) forming a conductive plug filling said gate opening;
      (1) said conductive plug is formed by a selective epitaxy process and said conductive plug is comprise of silicon;
   k) removing said insulating layer;
      (1) said insulating layer is removed by an etch selective to said barrier layer and said gate layer;
   l) forming a drain region in top and side portions of said conductive plug and forming doped gate regions in said gate layer; the remaining portions of said conductive plug comprise a channel region;
      (1) a channel length is between the top of said source region and said drain region; said channel length is preferably between about 50 and 1000 Å;
   m) forming silicide regions on the top of said conductive plug and on said gate layer;
   n) forming an interlevel dielectric layer over said barrier layer, said gate layer, and said conductive plug; and
   o) forming contacts through said interlevel dielectric layer to said doped gate regions, said drain region and said source region.

13. The method of claim 12 wherein said dielectric layer comprised of silicon oxide having a thickness of between about 20 and 100 Å.

14. The method of claim 12 wherein said barrier layer comprised of silicon nitride having a thickness of between about 50 and 100 Å.

15. The method of claim 12 said barrier layer 24 and said insulating layer have an etch rate ratio between 1:2 and 1:100 so that said insulating layer can be etch selectively to said barrier layer.

16. The method of claim 12 wherein said gate dielectric spacers 40 is comprised of silicon oxide and has a thickness of between about 10 and 100 Å.

17. The method of claim 12 wherein said gate dielectric spacers 40 formed by depositing a gate dielectric layer and anisotropically etching back said gate dielectric layer.

18. The method of claim 12 wherein the drain regions are formed by an angled ion implant an angled ion implant using P, As, Sb or B ions at a dose between 1E16 and 1E16 ions/cm$^2$ and an energy between 200 eV and 100 KeV.

19. A method of fabrication of a vertical transistor; comprising the steps of:
- a) forming isolation regions in a substrate; said isolation regions defining an active area;
- b) forming a source region in said active area;
- c) forming a dielectric layer over said active area and said isolation regions;
  - (1) said dielectric layer comprised of silicon oxide having a thickness of between about 20 and 100 Å;
- d) forming a barrier layer over said dielectric layer;
  - (1) said barrier layer comprised of silicon nitride having a thickness of between about 50 and 1000 Å;
- e) forming an opening in said barrier layer; said opening at least partially over said active area;
- f) forming a gate layer in said opening;
- g) forming an insulating layer over said conductive layer and said barrier layer;
- h) forming a gate opening through said insulating layer, said gate layer and said dielectric layer to expose said source region; said gate opening defines at least by sidewalls of said conductive layer;
- i) forming a gate dielectric spacers over said sidewalls of said gate layer;
  - (1) said gate dielectric spacers is comprised of silicon oxide and has a thickness of between about 10 and 100 Å;
  - (2) said gate dielectric spacers formed by depositing a gate dielectric layer and anisotropically etching back said gate dielectric layer;
- j) forming a conductive plug to fill said gate opening;
  - (1) said conductive plug is formed by a selective epitaxy process and said conductive plug is comprise of silicon;
- k) removing said insulating layer;
  - (1) said insulating layer is removed by an etch selective to said barrier layer and said gate layer;
- l) forming a drain region in top and side portions of said conductive plug and forming doped gate regions in said gate layer; the remaining portions of said conductive plug comprise a channel region;
  - (1) said drain regions formed by an angled ion implant;
  - (2) a channel length is between the top of said source region and said drain region; said channel length is preferably between about 50 and 1000 Å;
- m) forming silicide regions on the top of said conductive plug and on said gate layer;
- n) forming an interlevel dielectric layer over said barrier layer, said gate layer, and said conductive plug; and
- o) forming contacts through said interlevel dielectric layer to said doped gate regions, said drain region and said source region.

* * * * *